US011294004B2

(12) United States Patent
Zhang

(10) Patent No.: US 11,294,004 B2
(45) Date of Patent: Apr. 5, 2022

(54) GIANT MAGNETORESISTANCE-BASED BIOSENSORS

(71) Applicant: Jin Zhang, London (CA)

(72) Inventor: Jin Zhang, London (CA)

( * ) Notice: Subject to any disclaimer, the term of this patent is extended or adjusted under 35 U.S.C. 154(b) by 166 days.

(21) Appl. No.: 16/753,829

(22) PCT Filed: Oct. 9, 2018

(86) PCT No.: PCT/CA2018/051270
§ 371 (c)(1),
(2) Date: Apr. 6, 2020

(87) PCT Pub. No.: WO2019/068204
PCT Pub. Date: Apr. 11, 2019

(65) Prior Publication Data
US 2020/0284856 A1    Sep. 10, 2020

Related U.S. Application Data

(60) Provisional application No. 62/568,952, filed on Oct. 6, 2017.

(51) Int. Cl.
*G01N 27/72* (2006.01)
*G01R 33/09* (2006.01)
(Continued)

(52) U.S. Cl.
CPC .......... *G01R 33/093* (2013.01); *G01N 27/76* (2013.01); *B82Y 15/00* (2013.01)

(58) Field of Classification Search
CPC ....... G01R 33/093; G01N 27/76; B82Y 15/00
See application file for complete search history.

(56) References Cited

U.S. PATENT DOCUMENTS 6,485,985 B1 * 11/2002 Weitschies ....... G01N 33/54333
436/526
8,263,331 B2 * 9/2012 Bangert ........... G01N 33/54333
435/6.1
(Continued)

FOREIGN PATENT DOCUMENTS

EP    2818570 A1    12/2014

OTHER PUBLICATIONS

Pisana et al., "Graphene Magnetic Field Sensors", IEEE Transactions on Magnetics, vol. 46, No. 6, Jun. 2010, pp. 1910-1913.
(Continued)

*Primary Examiner* — Alesa Allgood
(74) *Attorney, Agent, or Firm* — Hill & Schumacher

(57) ABSTRACT

Disclosed is a system for detecting one or more target analytes which includes a resistor structure comprised of a substrate, a graphene-based nanocomposite material located on a surface of the substrate with the graphene-based nanocomposite material exhibiting one or more magnetoresistance properties. A surface of the nanocomposite material includes molecular sensing elements bound thereto which exhibit an affinity for binding with the target analytes. Electrodes are connected to the resistor structure connectable to a power source and a device for measuring a resistance across the resistor structure for sensing a giant magnetoresistance (GMR) value of the resistor structure. Included are magnetic colloidal nanoparticles exhibiting preselected magnetic properties with an outer surface of the magnetic colloidal nanoparticles being modified to allow interaction with the surface of the resistor structure resulting in a change in the GMR value of the resistor structure. The resistor structure is configured to be operably connected to a magnetic field generating device configured to apply a magnetic field to the graphene-based nanocomposite wherein the field has a magnitude in a range from greater than 0 to about 5 Tesla. A presence of target analytes in a vicinity of the surface of the resistor structure induces the interaction to occur by binding of the target analytes to the molecular sensing elements bound thereto causing a change in GMR value of the resistor structure.

24 Claims, 23 Drawing Sheets

(51) Int. Cl.
*G01N 27/76* (2006.01)
*B82Y 15/00* (2011.01)

(56) References Cited

U.S. PATENT DOCUMENTS

| 9,050,605 | B2 | 6/2015 | Guo | |
|---|---|---|---|---|
| 9,765,271 | B2 | 9/2017 | Myrick | |
| 2009/0065359 | A1* | 3/2009 | Zhou | G01R 33/093 |
| | | | | 204/556 |
| 2013/0316367 | A1* | 11/2013 | Zhou | B82Y 25/00 |
| | | | | 435/7.2 |

OTHER PUBLICATIONS

Abelian et al., "Graphene enhances the magnetoresistance of FeNi3 nanoparticles in hierarchical FeNi3—graphene nanocomposites", Journal of Materials Chemistry C, 2016, No. 4, pp. 2252-2258.
International Search Report of the parent PCT application PCT/CA2018/051270 filed Oct. 9, 2018. The mail date of search report is dated Jan. 16, 2019.

* cited by examiner

Strategy A (direct measure)

Step-1

Colloidal Magnetic nanoparticles with suitable surface modification-A

Colloidal Magnetic nanoparticles with surface modification

Strategy B (indirect measure through the competitive reaction)

Step-1

Colloidal Magnetic nanoparticles with suitable surface modification-B

Step-2

GIANT MAGNETORESISTANCE-BASED BIOSENSORS

FIELD

This disclosure relates to a graphene based nano-composite biosensor system that utilizes the giant magnetoresistance (GMR) effect to detect biological molecules for real-time and remote diagnosis.

BACKGROUND

The phenomenon of magnetoresistance (MR) in metallic materials has been known for over a century. Magnetoresistance involves the change of electrical resistance in metals upon application of a magnetic field. The magnitude of the change in electrical resistance is dependent on the structure of the electrical orbitals at the Fermi surface. There are two possible electron states when they are in transition as per the Mott model: "spin-up" orientation and "spin-down" orientation. The total current flowing through a structure is the sum of the current carriers with "spin-up" orientation and the sum of current carriers with "spin-down" orientation.

As shown in FIG. 1A, if the "spin-up" 104 and "spin-down" 106 currents are flowing through the ferromagnetic layer, e.g. iron (Fe), cobalt (Co), nickel (Ni), with a fixed direction of magnetization ("up" or "down"), the resistance between the flow paths of the first 101 and second 102 groups of electrons will differ. Conventional magnetoresistance resistors have limited applications as they will exhibit a change of resistance of less than 3%.

The Giant magnetoresistance (GMR) effect was discovered in 1980 and was originally a system made of alternating layers of magnetic and non-magnetic substrates. A sample with a structure containing these alternating magnetic and non-magnetic substrates will be able to achieve a more significant change in the electrical resistance under the application of a magnetic field. The GMR effect is particularly useful in sensor applications, where GMR sensors display significant advantages over traditional Hall-effect sensors in terms of physical size, sensitivity, temperature stability, and cost.

The unique, microstructure-dependent properties of graphene and graphene based nanomaterials mean that it has high potential for application in various fields such as automobiles, electronic devices, and biomedical instrumentation and devices. In regard to applications with GMR sensors, graphene displays better conductivity in comparison to semiconductors and is an excellent spacing layer in multilayer GMR sensors.

A Mott model may be used to explain the GMR phenomenon. As shown in FIG. 1B, electrical resistance is maximized 108 when the magnetic moments of the ferromagnetic 109 and non-magnetic 107 layers are antiparallel 112 (no external magnetic field) and it is minimized 110 when the magnetic moments of the layers are parallel 111 (with an external magnetic field). This effect occurs due to the spin-dependent scattering of the conduction electrons. By knowing the contribution to the overall magnitude of resistance from each orientation, the GMR can then be determined.

The GMR effect has shown a wide array of potential applications in magnetoelectronics. FIG. 2A, FIG. 2B, FIG. 2C and FIG. 2D shows the major types of GMR systems and substrates 200 within magnetoelectronics including multilayer GMR 202, spin valve GMR 204, pseudo-spin GMR 206, and granular GMR 208 respectively.

The thickness of each substrate layer has a significant impact on the GMR value of the resistor. The parameters relating to the mean free path of the conduction electrons in the spacer layer, the spacer layer thickness, and the thickness of the non-magnetic layer all impact the GMR value. The experimental and theoretical results of existing work in this field indicate that the thinner the multilayer, the higher the GMR value. Consequently, nanostructured GMR multilayers have attracted extensive attention for their applications to miniaturization of systems, especially in the areas of spintronic, data storage and magnetic sensing.

The application of the GMR effect with graphene-based multilayers has demonstrated that separation between spin-down and spin-up carriers in graphene are realized and carriers are spin polarized. Significant research has been completed to design multi-layered systems made by graphene sandwiched between two layer of ferromagnetic materials, which can achieve >20% increase in MR.

The prior art relating to the formation of magnetoresistance sensors by using exfoliating graphene deposited with Au electrodes by using e-beam lithography is also well documented. It indicates the electrical resistance of this MR device increased over 3% when magnetic field is zero. The magnetic field-dependent electrical resistance of this enhanced magnetoresistance sensor made by graphene-based multilayers can detect the magnetic field in the range of 500 Oe to 1.5 KOe. Although graphene-based multilayers have shown well-controlled GMR effect, granular-matrix structures by loading magnetic nanocrystals onto non-magnetic substrate, i.e. graphene sheets, could be an alternative materials for achieving GMR effect.

The major advantage of granular GMR materials lies in their cost-effective processes of synthesis. Quite recently, giant magnetoresistance effects have been observed in nanocomposite systems. Guo et al. reported that magnetic graphene/iron/iron oxide nanocomposites prepared by thermal-decomposition can achieve the magnetoresistance with high values of 46%-72% at room temperature under 90 KOe.

Both theory studies and experimental studies relating to GMR systems have demonstrated the feasibility of graphene-based granular structures for magnetoresistive devices but there is still limited knowledge relating to the interaction between magnetic nanocrystals and graphene sheets to achieve GMR effect. The graphene-based system presented herein provides several advantageous features including device and system miniaturization, high precision deposition of the magnetic particles and the ability to wirelessly interface the bio-sensing device.

SUMMARY

The present disclosure relates to a graphene-based system with special magnetic properties that has the potential to broaden the scope of the application of graphene products in real-time and remote diagnosis sensors.

The system for detecting one or more target analytes comprises:
  a) a first resistor structure comprising
    a substrate,
    a graphene-based nanocomposite material located on a surface of the substrate, the graphene-based nanocomposite material exhibiting one or more magnetoresistance properties, a surface of the graphene-based nanocomposite material including molecular sensing elements bound thereto which exhibit an affinity for binding with the target analytes, and electrodes connected to the resistor structure connectable to a power source and a device for measuring a resistance across the resistor structure for sensing a giant magnetoresistance (GMR) value of the resistor structure;

b) magnetic colloidal nanoparticles exhibiting preselected magnetic properties, an outer surface of the magnetic colloidal nanoparticles being modified to allow interaction with the surface of the resistor structure resulting in a change in the GMR value of the resistor structure;

c) the resistor structure configured to be operably connected to,
a magnetic field generating device configured to apply a magnetic field to the graphene-based nanocomposite wherein the field has a magnitude in a range from greater than 0 to about 5 Tesla;

wherein a presence of target analytes in a vicinity of the surface of the resistor structure induces the interaction to occur by binding of the target analytes to the molecular sensing elements bound thereto causing a change in the GMR value of the resistor structure.

In one embodiment the outer surface of the magnetic colloidal nanoparticles may be modified to include molecular sensing elements bound thereto which exhibit an affinity for binding with the target analytes, and wherein when target analytes are present in a vicinity of the magnetic colloidal nanoparticles they bind to the molecular sensing elements on the magnetic colloidal nanoparticles, and when the magnetic colloidal nanoparticles with target analytes bound thereto are in a vicinity of the surface of the resistor structure, the interaction with the surface is binding of the target analytes, bound to their respective magnetic colloidal nanoparticles, to the molecular sensing elements bound to the surface of the resistor structure.

In this embodiment the molecular sensing elements bound to the surface of the magnetic colloidal nanoparticles which exhibit an affinity for binding with the target analytes may include functional groups selected from the group consisting of hydrogen, hydroxyl, carboxyl, amine, amide, phosphate, thiol, methyl, and polyethylene glycol (PEG) derivatives.

In another embodiment the outer surface of the magnetic colloidal nanoparticles may modified to include competing molecules bound thereto which exhibit an affinity for binding with the molecular sensing elements bound to the surface of the resistor structure, and wherein when the target analytes are in a vicinity of the surface of the resister structure, the interaction with the surface is binding of the target analytes is displacement of the bound magnetic colloidal nanoparticles and binding of the target analytes to the molecular sensing elements bound to the surface of the resistor structure.

In this embodiment the competing molecules bound to the surface of the magnetic colloidal nanoparticles which exhibit an affinity for binding with the molecular sensing elements bound to the surface of the resistor structure may include functional groups selected from the group consisting of hydrogen, hydroxyl, carboxyl, amine, amide, phosphate, thiol, methyl, and polyethylene glycol (PEG) derivatives.

The magnetic colloidal nanoparticles may have a diameter in a range from about 1 nm to about 1000 nm.

The magnetic colloidal nanoparticles may be any one of Fe, Co, Ni, $Fe_xCo_y$ (x+y=100), $Fe_xNi_y$ (x+y=100), FePt, EuO, $Eu_{1-x}Gd_xSe$ (0.02≤x≤0.8), or $Gd_{3-x}S_4$ (0≤x≤0.8) based nanoparticles.

The magnetic colloidal nanoparticles are any one of nanoparticles containing Fe, Co, or Ni, or core-shell magnetic nanoparticles including silica coated magnetic nanoparticles, gold coated magnetic nanoparticles, or chitosan-coated magnetic nanoparticles.

The substrate may be comprised of any one of a ceramic, a polymer or a metal. The ceramic may comprise of any one of SiC or glass, and wherein the polymer may comprise any one of polydimethylsiloxane (PDMS) or biopolymers.

The system may further comprise two or more additional resistor structures mounted on the substrate and connected in series with the first resistor structure and the power supply and the device for measuring resistance and magnetoresistance, and wherein the magnetic field generating device is configured to apply the same magnetic field to all of the resistor structures.

The electrodes may comprised of metals or carbon-based materials, and the metals may be any one of gold (Au), tungsten (W), platinum (Pt).

The molecular sensing elements bound to the surface of the graphene-based nanocomposite material may include any one or combination of a glucose binding protein, Concanavalin A, glucose oxidase enzyme, boronic acid, antibody, DNA sequences, and amyloid-β-derived diffusible ligands (ADDLs).

The one or more target analytes being detected for may include any one or combination of glucose, DNA, proteins, lipids, or microbes.

The graphene-based nanocomposites may be comprised of graphene nanosheets loaded with magnetic nanocrystals. The weight ratio of said graphene to said magnetic nanocrystals is in a range from about 2:98 to about 98:2.

The thickness of the graphene-based nanocomposite may be in a range from about 100 nm to about 5 mm.

The magnetic colloidal nanoparticles and graphene-based nanocomposites are selected such that the interaction between magnetic colloidal nanoparticles and graphene-based nanocomposites changes the magnetic field in a range from about 5 Oe to about 30 KOe.

In use the mixture containing magnetic colloidal nanoparticles may be introduced onto the surface of the resistor structure by a liquid dispenser which can be any one of a pipettor, a pump-connected microfluidic system, or a fluidic loop system.

In use the magnetic colloidal nanoparticles which are not bound on the surface of resistor structure after being exposed thereto are removed from the surface of the resistor structure by any one of aqueous-based washing solution, or a pumping solvent removal system, or vortex microfluidic technology.

During preparation of the resistor structure, a thickness of the graphene-based nanocomposite material may be controlled by use of a hydraulic press, a method of physical deposition, a method of chemical coating or a method of 3-D printing.

The magnetic colloidal nanoparticles may have a diameter in a range from about 1 nm to about 1000 nm.

The system may be configured to be connected to a wireless system for real-time and remote detection.

A further understanding of the functional and advantageous aspects of the present disclosure can be realized by reference to the following detailed description and drawings.

BRIEF DESCRIPTION OF THE DRAWINGS

Embodiments will now be described, by way of example only, with reference to the accompanying drawings, in which.

DETAILED DESCRIPTION

Figure 1A:
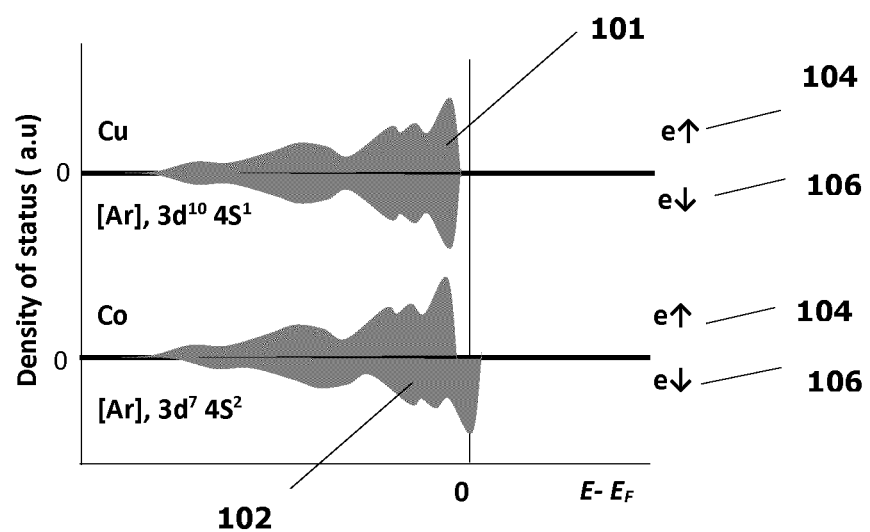
FIG. 1A is a graphical depiction of the magnetoresistance phenomenon related to the structure of the electrical orbitals at the Fermi surface.
Figure 1B:
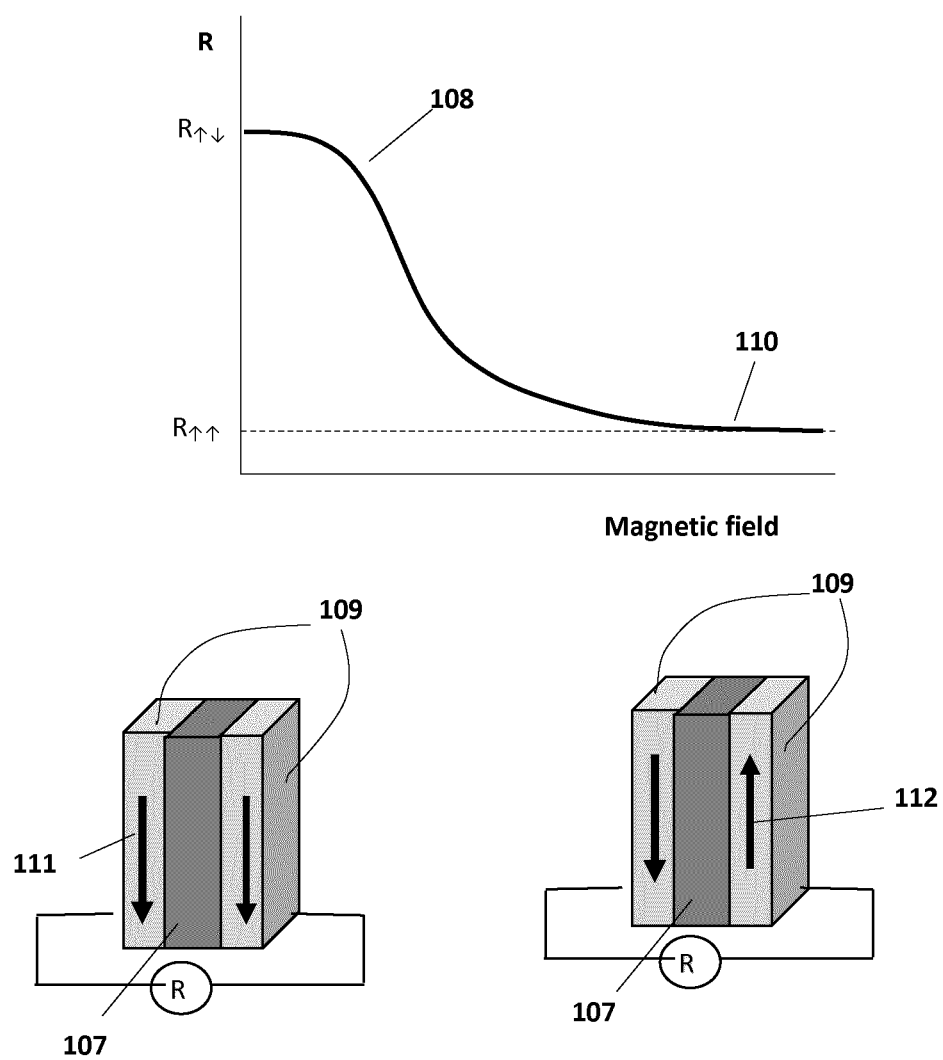
FIG. 1B is a schematic of multilayer magnetic films with giant magnetoresistance effect as disclosed herein.
Figure 2A:
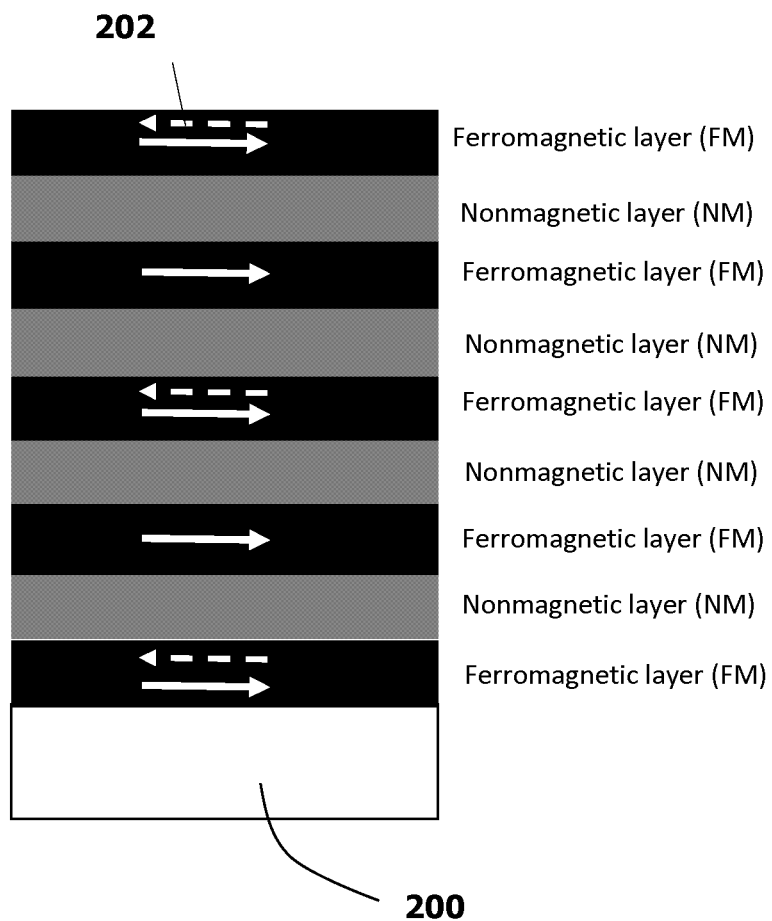
FIG. 2A is a schematic view of a multilayer giant magnetoresistance system (Prior Art)
Figure 2B:
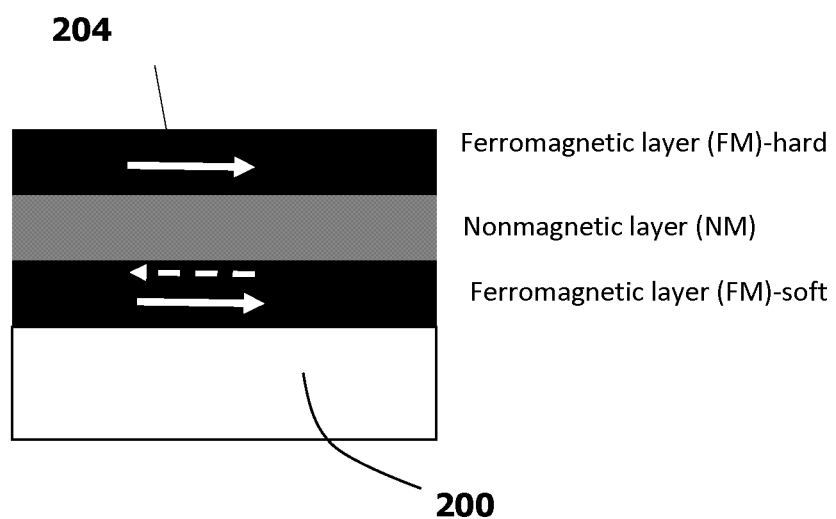
FIG. 2B is a schematic view of a spin valve giant magnetoresistance system (Prior Art)
Figure 2C:
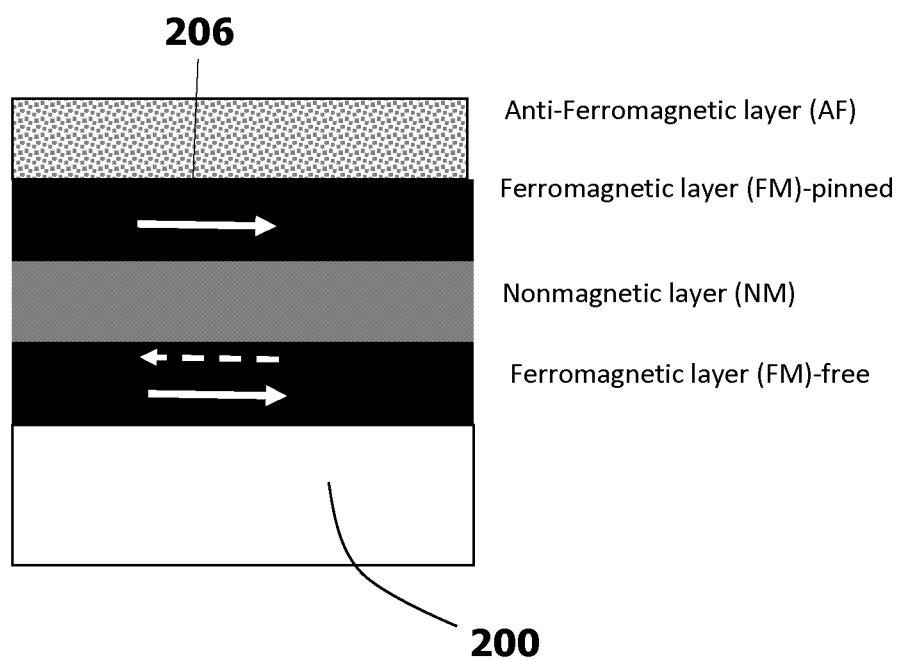
FIG. 2C is a schematic view of a pseudo-spin giant magnetoresistance system (Prior Art)
Figure 2D:
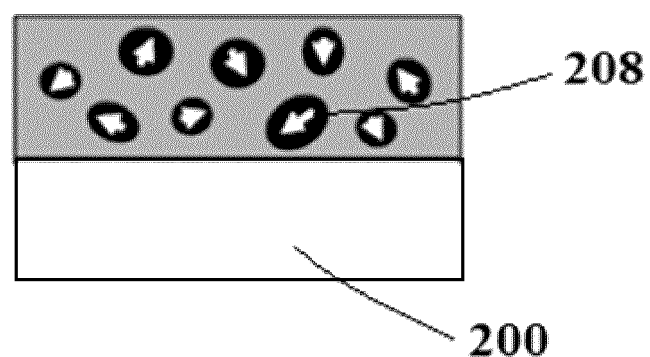
FIG. 2D is a schematic view of a granular giant magnetoresistance system (Prior Art)

Various embodiments and aspects of the disclosure will be described with reference to details discussed below. The following description and drawings are illustrative of the disclosure and are not to be construed as limiting the disclosure. The figures are not to scale. Numerous specific details are described to provide a thorough understanding of various embodiments of the present disclosure. However, in certain instances, well-known or conventional details are not described in order to provide a concise discussion of embodiments of the present disclosure.

As used herein, the terms, "comprises" and "comprising" are to be construed as being inclusive and open ended, and not exclusive. Specifically, when used in the specification and claims, the terms "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions. In one non-limiting example, the terms "about" and "approximately" mean plus or minus 10 percent or less.

As used herein, the phrase "Giant magnetoresistance (GMR) effect" refers to the significant change (>3%) of electrical resistance of a material or a device under a magnetic field.

As used herein, the phrase "graphene-based nanocomposite" refers to a composite made of graphene and hybrid graphene, and magnetic nanostructures.

As used herein, the phrase "sensing elements" refers to the chemical molecules, or biomolecules, which is able to involve in a reaction with targeted molecule.

Unless defined otherwise, all technical and scientific terms used herein are intended to have the same meaning as commonly understood to one of ordinary skill in the art.

Methodology

The currently disclosed process involves the loading of magnetic nanocrystals into graphene sheets. Several different embodiments of the currently claimed process involve different wet chemical processes which will incorporate the magnetic nanocrystals into graphene-based sheets.

In an embodiment, a method is applied to produce iron (Fe)-loaded graphene sheets. The method of this embodiment is a specific chemical process that is applicable for generating graphite oxide through the addition of potassium permanganate to a solution of graphite, sodium nitrate, and sulfuric acid. It may be utilized for producing quantities of graphite oxide. In this embodiment, graphite is oxidized to graphene oxide (GO) by potassium permanganate and sulfuric acid. At a neutral pH value, the graphene oxide is reduced to graphene via Fe powder. 1 g of Fe powder (average particle size: 10 μm.) and 20 mL of HCl (35 wt %) is directly added into 100 mL of GO suspension (0.5 mg/mL) at ambient temperature. The mixture is then stirred for 30 min and then maintained for a period of time. After reduction, 15 mL of HCl (35 wt %) is added into the GO solution in order to fully remove excess Fe powder. Finally, the graphene sheets is collected through filtration, and are washed with pure water and ethanol several times, and dried at 100° C. for 12 hours (h) in a vacuum oven.

Figure 3A:
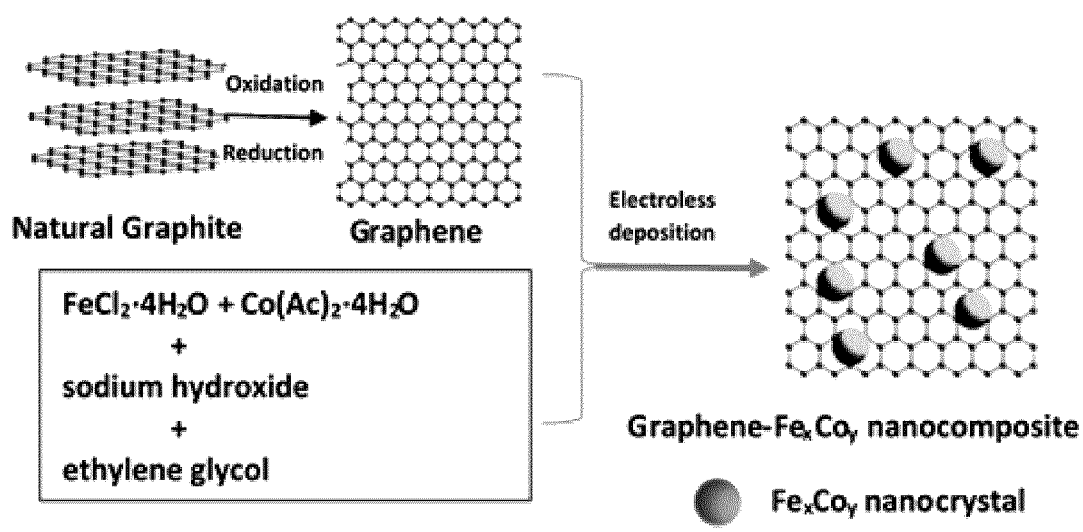
FIG. 3A is a schematic of the deposition process of Graphene-FexCoy nanocomposites made by an electroless deposition

In an additional embodiment of the process for forming loaded graphene sheets, an electrolytic process is applied to deposit magnetic nanoparticles ($Fe_xCo_y$ nanocrystals, etc.) onto graphene sheets as shown in FIG. 3A. In this embodiment, magnetic graphene/$Fe_{50}Co_{50}$ hybrid nanosheets are synthesized by growing $Fe_{50}Co_{50}$ crystals onto graphene nanosheets via a facile polyol process. First $Fe_{50}Co_{50}$ crystals were synthesised through a modified polyol process according to reference (Kodama D, et al. *Adv Mater* 18, 3154-3159 (2006). Briefly, 2.5 mmol $FeCl_2 \cdot 4H_2O$ and 2.5 mmol $Co(Ac)_2 \cdot 4H_2O$ metal salts precursors were mixed with 200 mmol sodium hydroxide in 100 mL ethylene glycol. The mixture was stirred under nitrogen gas protection and heated to 130° C. After 1-hour reaction at 130° C., the black mixture was collected by magnet and washed by pure ethanol. The crystals were dried in vacuum under room temperature.

Graphene/$Fe_{50}Co_{50}$ hybrid nanosheets were synthesizing by the following procedure, varied graphene powder (30 mg, 60 mg and 120 mg, samples namely $G_{9.5}FeCo_{90.5}$, $G_{17.3}FeCo_{82.7}$ and $G_{29.5}FeO_{70.5}$ respectively, the subscript is weight ratio percentage), metal precursors (2.5 mmol $FeCl_2 \cdot 4H_2O$ and 2.5 mmol $Co(Ac)_2 \cdot 4H_2O$) and 200 mmol sodium hydroxide was mixed in 100 mL ethylene glycol and reacted at 130° C. for 1 hour under nitrogen gas protection. In this polyol process, the $Fe_{50}Co_{50}$ crystals were deposited on the graphene nanosheets surface. The Graphene/$Fe_{50}Co_{50}$ hybrid nanosheets were collected by magnet and washed by ethanol and freeze-dried. Graphene/$Fe_{50}Co_{50}$ nanosheets powder was pressed into thin film pellets for 4-probe magnetoresistance measurement. To control the thickness of the graphene-based GMR sensor, different methods can be used including hydraulic press, a method of physical deposition, a method of chemical coating, or a method of 3-D printing. The graphene and $Fe_{50}Co_{50}$ crystals weight ratio are calculated using nominal adding chemical amount.

Figure 3B:
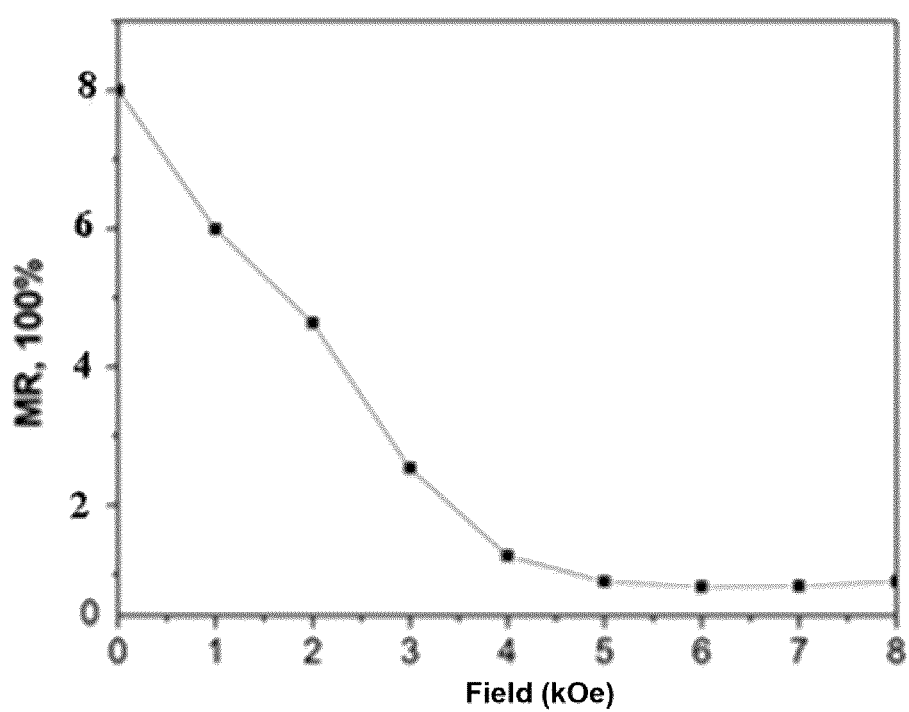
FIG. 3B is a graphical illustration of the change in magnetoresistance of graphene deposited with field size of FeCo nanocrystals measured by a vibrating sample magnetometer.
Figure 3C:
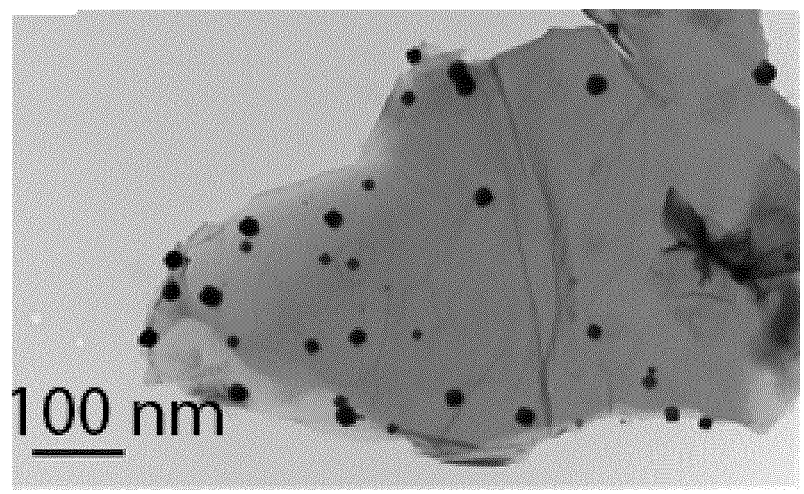
FIG. 3C is a TEM micrograph of the graphene-based nanocomposite.

The $Fe_{50}Co_{50}$-graphene nanocomposites show strong ferromagnetic properties with high saturation magnetization. An unexpected result of this particular embodiment of the method is that the prepared graphene/$Fe_{50}Co_{50}$ hybrid nanosheets show a magnetoresistance effect as high as 7.8±0.5% at low magnetic field of 9.5 kOe at room temperature. This phenomenon is further displayed in FIGS. 3A and 3B. In this non-limiting experimental example, the magnetoresistance of graphene which was deposited with FeCo nanocrystals, shown in FIG. 3A was measured using a vibrating sample magnetometer (VSM). The hybrid nanosheet pellets exposed in this micrograph also demonstrate magnetic anisotropic properties as is demonstrated by the measured magnetoresistance as shown in the TEM micrograph of the graphene based nanocomposites of FIG. 3B. The GMR effect of graphene nanocomposites is likely related to the high spin carrier/mobility.

In an embodiment, the synthesis of magnetic nanoparticles that physically deposit on graphene sheets is controlled through a laser-based fabrication device. A laser-assisted fabrication system is utilized to achieve the physical deposition of the magnetic nanoparticles. The pulsed-laser fabrication system is equipped with an optical parametric oscillator (OPO) which enables fine tuning of the wavelength of the laser from 532 to 1900 nm. This embodiment utilizes the process of matrix assisted pulsed laser evaporation (MAPLE). MAPLE provides a more moderate and protective method to deposit organic and inorganic nanoparticles on various substrates. MAPLE is a contamination free surface modification system. In this embodiment, the target material is normally dissolved or suspended in solvent which is highly volatile. The solution is then frozen by liquid nitrogen, and the frozen solution (target) is irradiated by a pulsed laser beam.

Figure 4A:
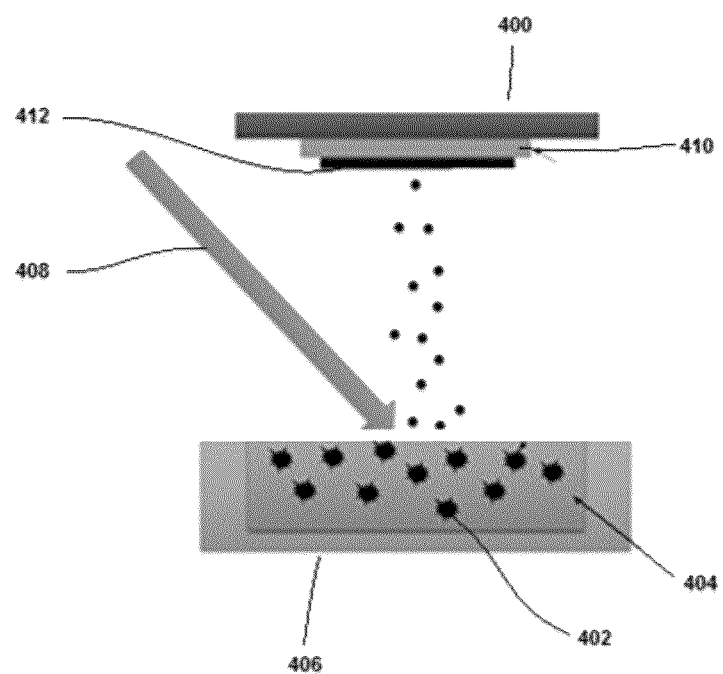
FIG. 4A is a schematic of a MAPLE process for depositing nanoparticles on a graphene sheet.
Figure 4B:
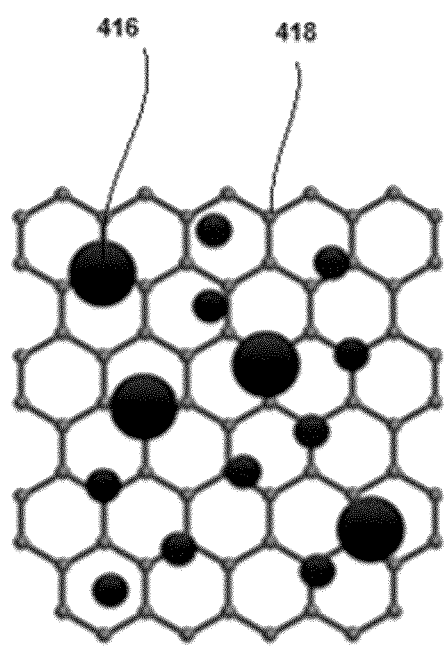
FIG. 4B is a view of the graphene sheet from FIG. 4A.

In an embodiment, the entire process is performed under vacuum ($1 \times 10^{-6}$ Torr) where solvent molecules are pumped away, and the target nanoparticles, which are heavier than the solvent molecules, remain in the chamber and are deposited on the surface of the substrate. Generally, the Nd:YAG laser (wavelength 532 nm) has 10 Hz frequency, and $T_{fwhm} \cong 200$ μs. The resulting laser fluence is 0.120 J/cm2 with a laser spot size diameter of 0.56 cm and will result in the deposition of hybrid nanostructures on the surface of the substrate Referring to FIG. 4A and FIG. 4B, the currently claimed embodiment of the physical process involves deposition of Fe-based nanoparticles 416 on graphene sheets 418 by the MAPLE process. The substrate holder 400 contains mounted graphene sheets 412 which are coated by a ceramic substrate 410. This coating by the ceramic substrate may be achieved though dip-coating and/or spin coating at room temperature. The magnetic powder 402 is suspended in a suitable solvent 404 and is then introduced into the target holder 406 cooled by liquid nitrogen, which is filled in the sidewall of the target holder. In the MAPLE process, the Fe-based powder is ablated by the laser irradiation 408 due to the photon-electron interaction.

Figure 4C:
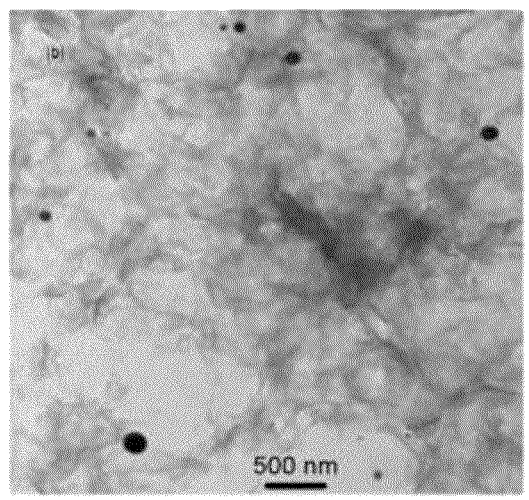
FIG. 4C is a TEM micrograph of graphene-Fe nanocomposite by MAPLE for 60 min.

Under the high vacuum, the ablated nanoparticles can be transported with the evaporated solvent to the graphene sheets in a contamination-free manner, and without damaging the graphene sheet as the solvent is pumped away during the deposition process. Energy dispersive X-ray analysis (EDX) with a TEM was carried out for the element analysis was carried out by and confirmed the presence of Fe. FIG. 4C shows the TEM micrograph of graphene sheet with the deposition of Fe nanoparticles under laser irradiation for 60 minutes.

To achieve the GMR effect in graphene nanocomposites, the interaction between graphene and magnetic nanoparticles should preferably be closely and accurately controlled. Magnetic properties of the resulting sheets are particularly affected by these interactions. The GMR effect of different designs of graphene nanocomposites is varied by utilizing various magnetic nanocrystals and by arranging the magnetic nanocrystals on or within the targeted graphene sheet(s). The magnetic properties will vary as a function of temperature from 80K to 300K under a magnetic field from 100 Oe to 10 KOe.

The magnetoresistance curves may be measured by an accessory 4-probe detecting device of a VSM, the sample plane and a current applied parallel to the applied magnetic field. In this experimental setup, the magnetoresistance value is determined by analysing changes in the resistance at an instance of zero magnetic field application and any other instance where a field is applied. The MR value is highly dependent on the distance between magnetic nanocrystals on/in the graphene sheets, the size of magnetic nanocrystals, and the type of magnetic crystals.

In addition to the various embodiments of the fabrication process, the effect of the ratio of nanoparticles and graphene matrix on GMR effect have been systematically studied in the range of 100 Oe to 10 KOe to establish a viable detection range for the GMR sensor. Bio-conjugation of the nanocomposite GMR leads in this sensor enables the devices capability to detect various biomolecules-involved in the reaction. The graphene-based GMR sensor is advantageous for three significant reasons. First, the sensor can be utilized as a platform for diagnosis of various diseases. The sensor can also be used for detecting biomolecules-involved processes in various body fluids including but not limited to, blood, tears, saliva, and urine. Lastly, the graphene based GMR sensors are also useful for detecting changes in biomarker levels within bodily fluid through detecting corresponding changes in the electrical resistance of the GMR sensor. The detected changes in the biomarker level can be transferred through computer/wireless system for real-time and remote diagnosis.

Design of GMR Biosensor

Figure 5:
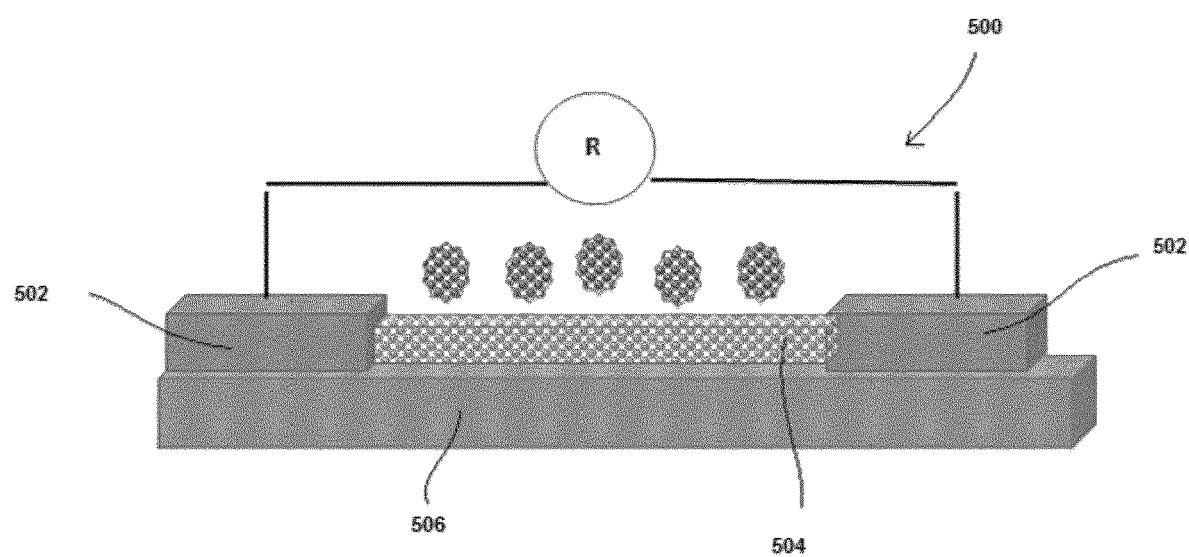
FIG. 5 is an Illustration of the graphene-based GMR biosensor device.

Referring to FIG. 5 a biosensor device 500 is shown that employs the graphene-based nanocomposite 504 or multiple graphene-based nanocomposies in a designed electrical circuit to have the GMR effect and electrodes 502 (where the electrode is composed of metals including but not limited to Au and Pt, or carbon-based materials) onto a mounting substrate 506 (where the substrate is composed of ceramics including but not limited to SiC and glass, or polymer-based materials) for detecting the electrical resistance while the magnetic field is changed in the range of 10 Oe to 30 KOe.

Figure 6A:
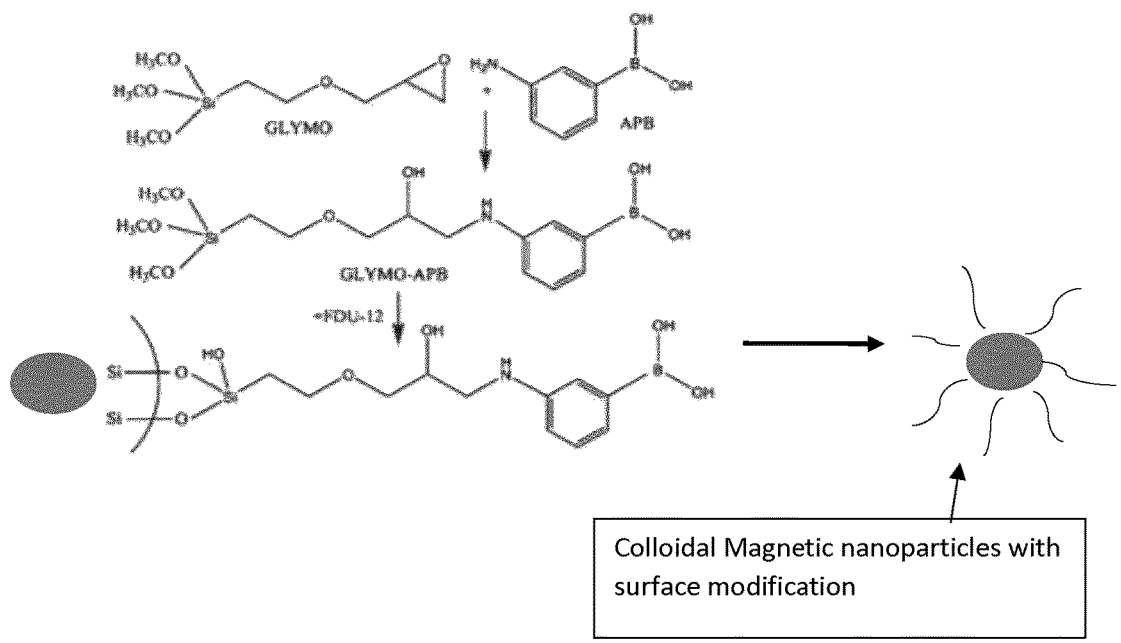
FIG. 6A is a schematic diagram of the direct measurement process using the GMR biosensor device
Figure 6A:
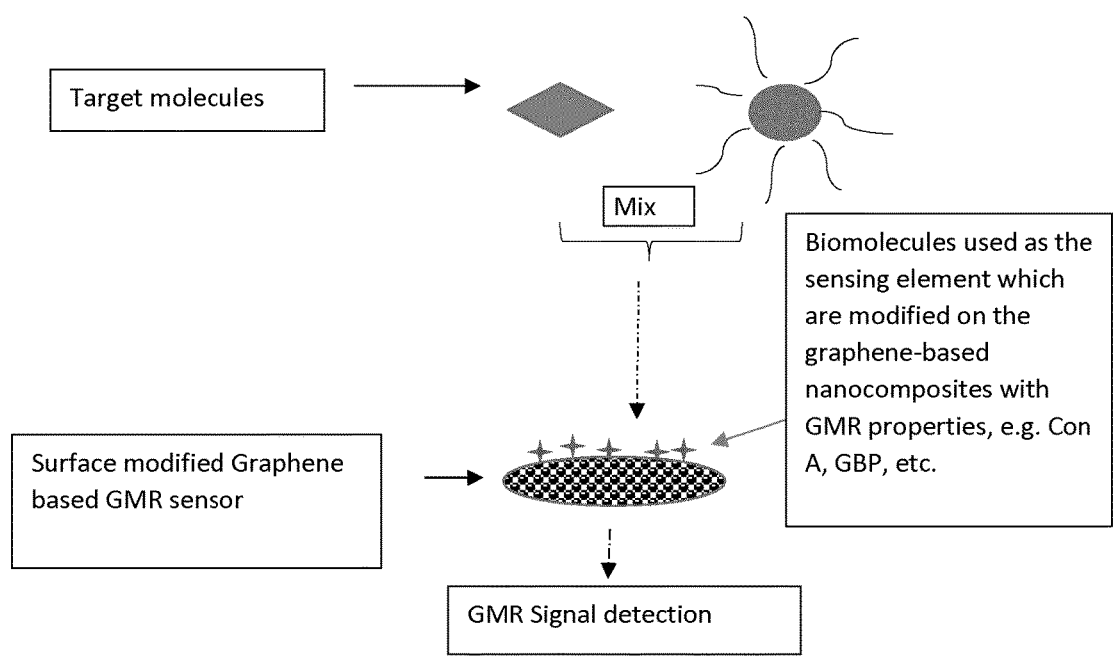
Figure 6B:
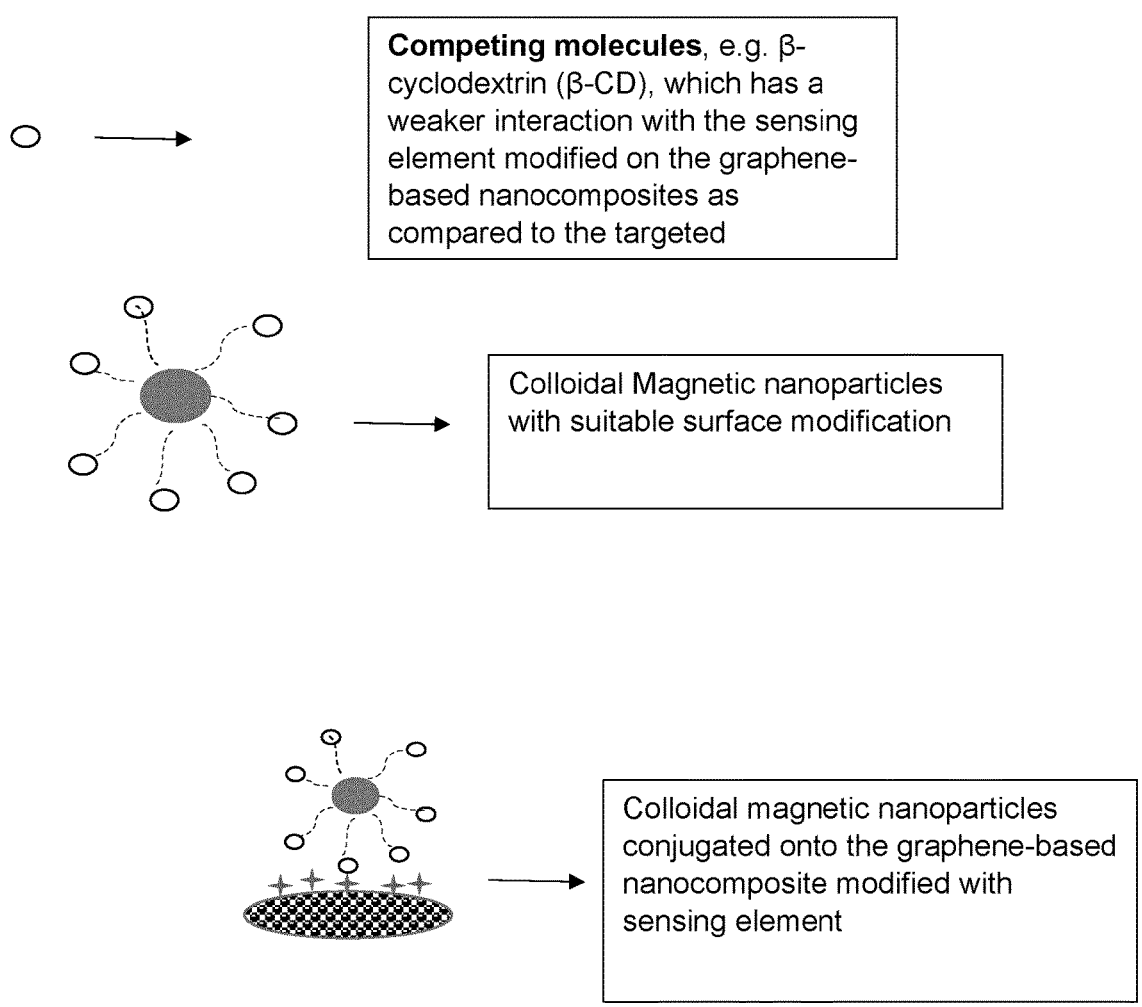
FIG. 6B is a schematic diagram of the competitive measurement process using the GMR biosensor device.
Figure 6B:
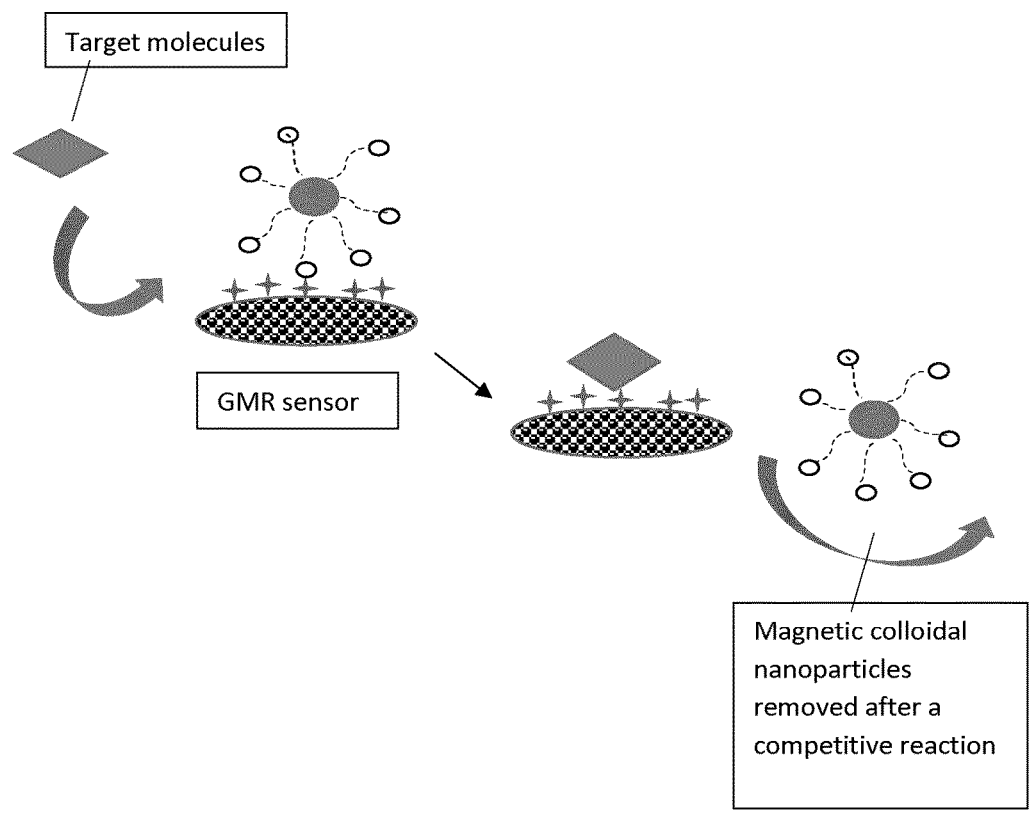

Referring to FIGS. 6a and 6b, the currently claimed system utilizes methods (two or more electrodes) for measurement within a GMR based biosensor; direct measurement, and in-direct measurement, i.e. competitive measurement, for detecting biomolecules-involved reactions.

FIG. 6a is an illustration showing the direct method. The targeted molecules interact with the magnetic colloidal nanoparticles modified with functional group, e.g. hydroxyl, carboxylic acid, amine, amide, phosphate; following that, the magnetic nanoparticles binding with target molecules or target analytes can directly interact with the sensing elements on the surface of graphene-based GMR sensor. The magnetic colloidal nanoparticles binding with target analytes will be introduced on to the graphene-based GMR sensor by a liquid dispenser by applying any one of the techniques; e.g. pipettor, a pump-connected microfluidic system, or a fluidic loop system. The GMR or MR value will change as a function of the amount of magnetic nanoparticles binding with targeted molecules.

FIG. 6b is an illustration showing the in-direct method. The magnetic colloidal nanoparticles binding with competing molecules interact with the surface of the graphene based GMR sensor, resulting in the changes of the GMR or MR value of the graphene based GMR sensor. The magnetic colloidal nanoparticles binding with competing molecules will be introduced on to the graphene-based GMR sensor by a liquid dispenser by applying any one of the techniques; e.g. pipettor, a pump-connected microfluidic system, or a fluidic loop system. The competing molecules, e.g. β-cyclodextrin (β-CD), has a weaker interaction with the sensing element modified on the graphene-based nanocomposites as compared to the targeted molecules, e.g. glucose. In the presence of targeted molecules, the targeted molecules will compete with the magnetic nanoparticles binding with competing molecules to bind on the graphene-based nanocomposites; and the replaced magnetic colloidal nanoparticles will be removed by an aqueous-based washing solution which can be cleaned by any one of the following methods, pumping solvent removal system, or a vortex microfluidic technology pumping solvent removal system. Therefore, the signal of the graphene based GMR sensor with be restored with increasing the targeted molecules.

Current experiments completed using these two methods of measurement for the GMR sensing of biomolecules-involved reaction have employed glucose and DNA in the sensing process. The sensing process could additionally utilize other molecular structure including but not limited to antibody, antigen, growth factor, etc.

Figure 7A:
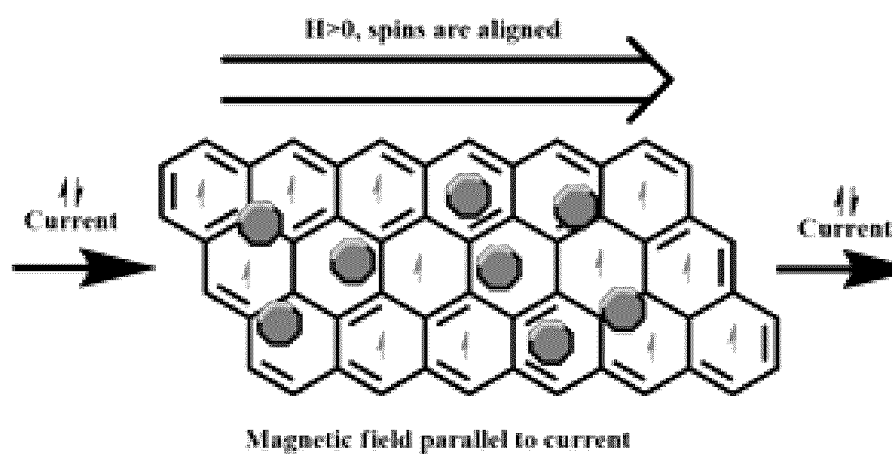
FIG. 7A is a schematic of current applied to a graphene sheet where Fe50Co50 crystals are randomly distributed on the sheet.
Figure 7B:
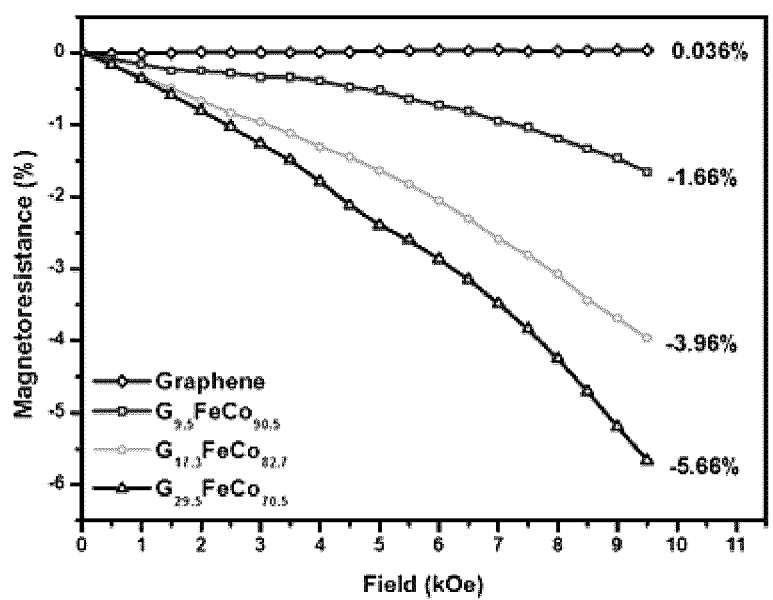
FIG. 7B is a graphical representation of the magnetoresistance of various graphene sheet samples at room temperature
Figure 7C:
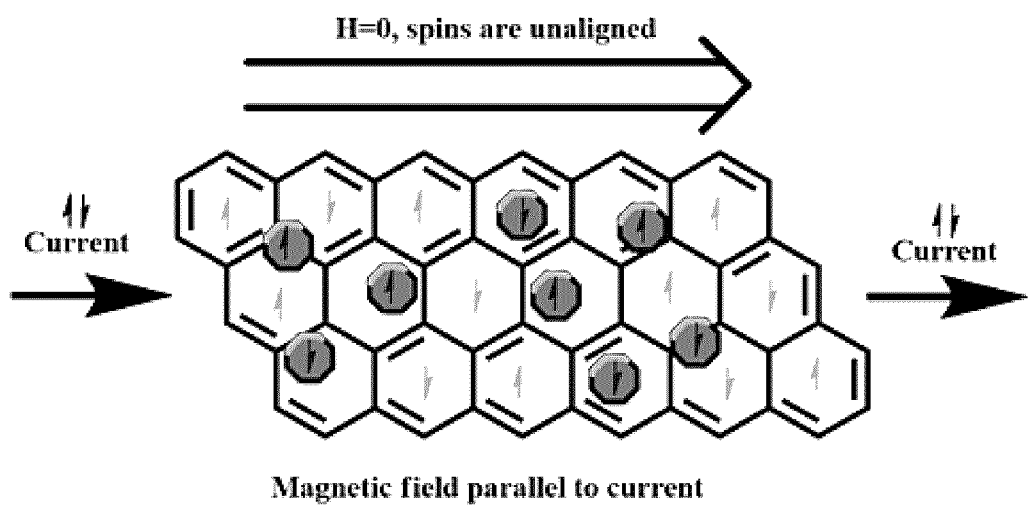
FIG. 7C is a schematic of a current applied to a graphene sheet where the spins of the sheet/crystals are unaligned and the applied magnetic field has a zero magnitude.
Figure 7D:
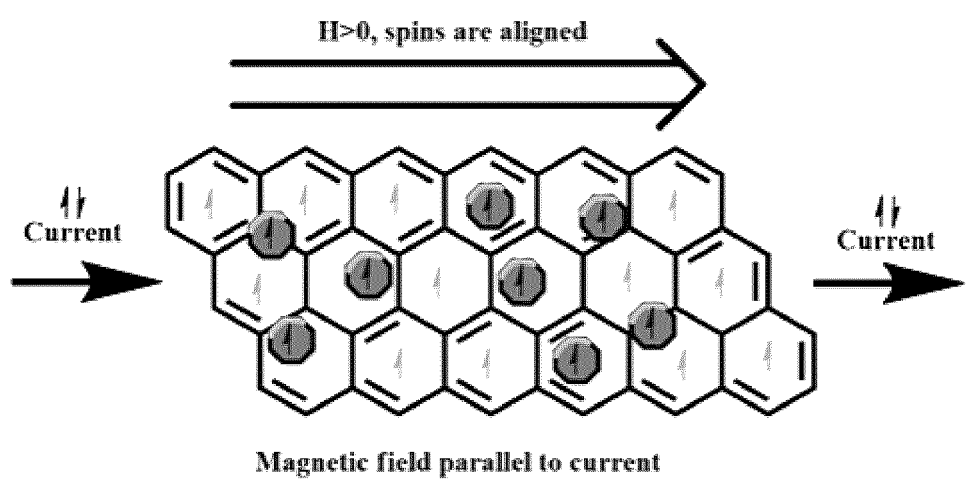
FIG. 7D is a schematic of a current applied to a graphene sheet where the spins of the sheet/crystals are aligned and the applied magnetic field has a positive magnitude.

Referring to FIG. 7A the current is applied parallel to applied magnetic field on graphene-based nanocomposites made of graphene and $Fe_{50}Co_{50}$ nanocrystals. FIG. 7C illustrates the resulting samples where the resulting magnitude of the applied magnetic field is zero, and the spins of the electrons in the crystals and graphene sheets are unaligned. FIG. 7D illustrates the resulting samples where the magnitude of the applied field is greater than zero, and the spins of the current electrons and the electrons in the magnetic nanocrystals and graphene sheets are aligned. These schematics illustrate the magnetic field effect of the samples resulting from the various deposition processes described previously. The magnetoresistance of samples at room temperature for various combinations was analyzed and the resulting MR of pure graphene (G) sheets, G9.5FeCo90.5, G17.3FeCo82.7 and G29.5FeCo70.5 hybrid nanosheets is displayed in FIG. 7B.

The magnetoresistance nanocomposites made of magnetic nanoparticles-loading graphene sheets are produced to have a thickness in the range of 100 nm to 500 μm.

In the various embodiments disclosed herein, surface modification of the graphene-based nanocomposite with GMR properties may be achieved through a variety of modification methods.

In a first embodiment of the modification method, 3-Aminopropyl-triethoxysilane (APTES) is utilized to modify the surface of the GMR sensor. In this modification method, the surface of the graphene-based nanocomposite patch is first cleaned through a purified water wash and is then dried by applying a stream of nitrogen gas to the nanocomposite patch. 3-Aminopropyl-triethoxysilane (APTES) solution in DMSO (5%, w/v, 2 μL) is then applied to the surface of the FeCo nanoparticles-loading graphene sheets. The nanocomposite patch with surface modification and kept for between 3 and a half to 4 and a half hours at room temperature. Once again, the surface is washed by water and dried by nitrogen gas. Lastly, glutaraldehyde (10%, 2 μL) is applied to the surface for 2 hours followed by a final water wash and nitrogen gas drying step.

In a second embodiment of the modification method Con A is utilized to modify the surface of the modification of GMR sensor. In this embodiment, the Con A solution (1 mg/mL) with a volume of 2 μL was applied to the nanocomposite surface for 2 hours at a temperature of approximately 4 degrees C. The nanocomposite surface is then water washed, dried and stored in a concealed space at approximately −20 degrees C.

In one non-limiting example of the surface modification method using Con A, or other sensing elements for detecting glucose, a colloidal magnetic nanoparticle with suitable surface modification is prepared. To prepare this exemplary colloidal magnetic nanoparticle, iron oxide (with a core size of approx. 7 nm) silica (with a shell size of approx. 22 nm) are prepared as follows. A one-pot reaction incorporates base-catalyzed oxidization of iron chlorides ($FeCl_2/FeCl_3$) followed a condensation, polymerization of tetraethylorthosilicate (TEOS) for silica coating on iron oxide, and encapsulation of organic dye in the shell. First 7.3 g of cetyltrimethyl ammonium bromide (CTAB) was added in 150 mL of toluene. The mixture was stirred at 600 rpm for 4 h, followed by slowly adding the aqueous $FeCl_2/FeCl_3$ solution (0.2 g/0.5 g, 7.2 mL) under nitrogen ($N_2$) atmosphere.

Upon completion, the reaction mixture was purged with $N_2$ for 2 h before it was stirred vigorously for 8 h. An ammonium hydroxide solution (35% $NH_4OH$ in water, 1.0 mL) was then dropped in the solution under N2 protection. The solution was continuously stirred for another 4 h. After then, 7.4 mL of TEOS and 20 mL of toluene were added dropwise. 0.8 mL of ammonium hydroxide solution was then mixed in the one-pot solution under $N_2$ atmosphere. The mixture was continuously stirred for 5 days under $N_2$ atmosphere. The pH of mixture was maintained at 8.5-9. The reaction was stopped by an addition of ethanol. The brownish surfactant was removed through centrifuging the solution. The residue was dissolved in ethanol (200 mL), which was refluxed for 15 h at 78° C. before it was cooled down to room temperature. The dark brown precipitates were washed by the mixture of ethanol, water, and acetone with volume ratio of 1:1:1 for three times and collected with magnets. The final product was then freeze-dried and stored as fine powder (reference: Jin Zhang, et al. *, *Nanoscale Res. Lett.,* 4. 1297, 2009).

In a next step of this non limiting example, 3-Glycidyloxy-propyltrimethox-ysilane (GLYMO, 98%) and 3-aminophenylboronic acid monohydrate (APB, 98%) are mixed to form GLYMO-APB (GA). In a next step, approximately 5 mL of the formed GA solution is mixed with 20 mg iron oxide/silica through controlled stirring at 75 degrees Celsius for approximately 2 hours. The mixture of the iron oxide/silica and GA solution is then centrifuged and an additional 5 mL GA is added to the product for modification. The final product of this mixing is then centrifuged and washed.

Figure 8:
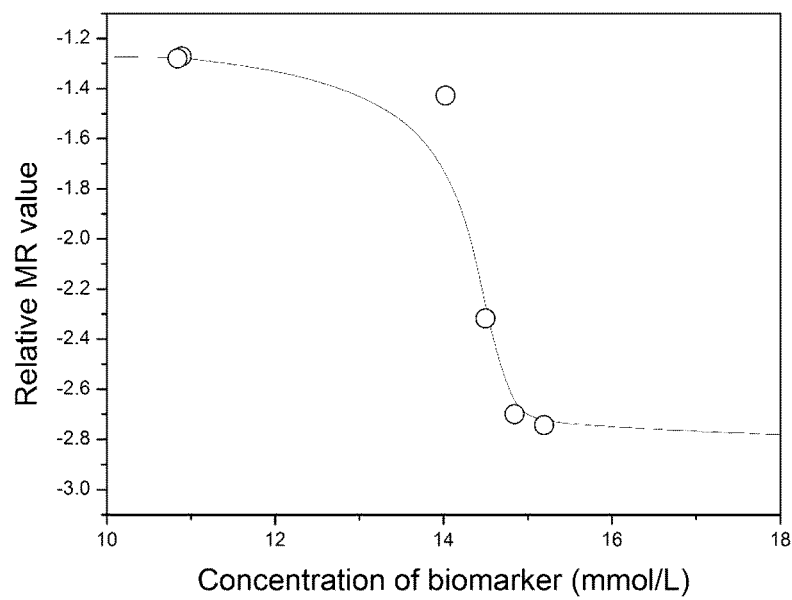
FIG. 8 is a graphical illustration of the relative GMR value and its relation to the concentration of targeted biomolecules.

In an embodiment, the sensor performance may be evaluated to determine accuracy and repeatability. In a non-limiting example, glucose solution (1 mg/mL (5.5 mM), 10 mL) is mixed with approx. 1 mg of the previously discussed colloidal magnetic nanoparticles with surface modification (The discussed iron oxide/silica-GA particles). The magnetic colloidal nanoparticles binding with the target analytes, e.g. glucose, may be introduced on to the surface of the graphene-based GMR sensor by a liquid dispenser by applying any one of the following techniques; pipettor, a pump-connected microfluidic system, or a fluidic loop system. In this same non-limiting example, the concentration of the glucose-binding magnetic colloidal nanoparticles was actively sensed over a range from 0.2 mg/mL to 1 mg/mL with a sensing interval 0.2 mg/ml The sensor performance results of this example are shown in FIG. 8 whereby a relatively strong correlation curve was determined between the sensed concentration of biomarkers and the sensed relative magnetoresistance value.

The GMR biosensor disclosed herein has numerous potential applications in detecting target molecules for diagnosis of diseases such as various forms of cancer and diabetes. Current test procedures have focused on applying the GMR biosensor to detect targeted molecules, glucose, DNA, ADDLs (amyloid-β-derived diffusible ligands), and other relevant biomarkers for diagnosis of diseases, e.g. diabetes, cancer, Alzheimer's disease. The results of these studies, as shown in FIG. 8 indicate that a larger magnitude of the relative GMR value will result in a significant increase in the concentration of targeted biomolecules that are registered by the biosensor.

Figure 9:
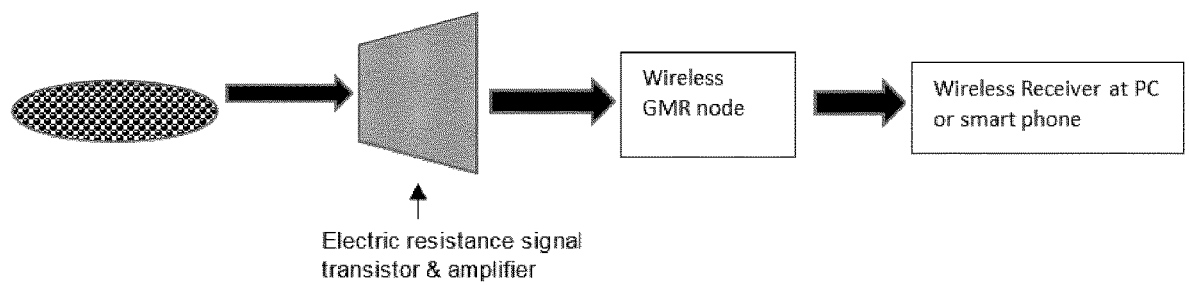
FIG. 9 is a schematic diagram of the integration of GMR biosensor by using graphene nanocomposites into wireless system.

In an additional embodiment, the nanocomposite GMR biosensor may be integrated into a wireless communications system. In this embodiment, a Digi XBee™ unit is linked with the GMR sensor as shown in the FIG. 9. A computer processing unit with user control channels can then be used to control the input/output signals from the biosensor to enable the sensor to be utilized for real-time and remote diagnosis. The GMR biosensor may be connected to an electric resistance signal transistor and amplifier device which in turn may be connected to a wireless GMR node which will relay data from the sensor to a wireless receiver in a PC or smart phone device.

A significant advantage of the sensor disclosed herein is that the designed graphene-based nanocomposite shows GMR signal at a magnetic field<5 Tesla, while most reported GMR materials cannot show GMR phenomenon at such low magnetic fields.

In summary, the present disclosure provides a system for detecting one or more target analytes. The system includes one or multiple resistor structures. A resistor structure comprises a substrate and coated on the substrate is a graphene-based nanocomposite material located on a surface of the substrate. The graphene-based nanocomposite material exhibiting one or more magnetoresistance properties. The composite is made of magnetic nanoparticles-loaded graphene sheets. The magnetic nanoparticles may have a size in a range from about 1 nm to about 1000 nm. A preferable size range of the thickness of the graphene-based nanocomposites is from about 100 nm to about 5 mm.

Non limiting examples of the types of magnetic nanoparticles that can be used include any one of nanostructures made of iron (Fe), or cobalt (Co), or nickel (Ni), or alloys and/or compounds containing iron (Fe), and cobalt (Co), and nickel (Ni), platinum (Pt), and rare-earth, for instance, $Fe_3O_4$, CoO, NiO, $Fe_xCo_y$ (x+y=100), $Fe_xNi_y$ (x+y=100), FePt, FePtCo, FePtNi, EuO, $Eu_{1-x}Gd_xSe$ ($0.02 \le x \le 0.8$), or $Gd_{3-x}S_4$ ($0 \le x \le 0.8$), to mention a few.

Methods of loading the nanoparticles may include a polyol process, electrochemical plating, chemical vapor deposition, physical deposition, laser-assisted deposition. The interaction between magnetic nanoparticles and graphene sheets can be physical and chemical bonding. The weight ratio of magnetic nanoparticles to graphene is preferably in a range from about 98:2 to about 20:80.

The polyol process involves a polyol solution (e.g. ethylene glycol and sodium hydroxide) used as a reductive agent and surfactant for reducing metallic compounds to magnetic nanocrystals and depositing the magnetic nanocrystals on graphene sheets. The reaction temperature is in a range of 100° C. to 300° C.

A surface of the graphene-based nanocomposite material includes molecular sensing elements bound thereto which exhibit an affinity for binding with the target analytes. Electrodes are connected to the resistor structure to enable electrical connection to a power source and a device for measuring the resistance across the resistor structure for sensing a giant magnetoresistance (GMR) value of the resistor structure.

The system includes magnetic colloidal nanoparticles exhibiting preselected magnetic properties with an outer surface of the magnetic colloidal nanoparticles being modified to allow interaction with the surface of the resistor structure resulting in a change in the GMR value of the resistor structure. The system includes a magnetic field generating device configured to apply a magnetic field to the graphene-based nanocomposite wherein the field has a magnitude in a range from greater than 0 to about 5 Tesla.

The interaction between the magnetic colloidal particles and the surface of the resistor structure having the molecular sensing elements bound thereto is mediated through the target analytes when these are present in a sample being tested binding to the molecular sensing elements. It is this binding of the target analytes to the sensing elements which cause the interaction leading to a change in the GMR value of the resistor structure.

In one embodiment, the outer surface of the magnetic colloidal nanoparticles are modified to include molecular sensing elements bound thereto which exhibit an affinity for binding with the target analytes. When target analytes are present in a vicinity of the magnetic colloidal nanoparticles they bind to the molecular sensing elements on the magnetic colloidal nanoparticles, and when the magnetic colloidal nanoparticles with target analytes bound thereto are in a vicinity of the surface of the resister structure, the interaction with the surface is binding of the target analytes, bound to their respective magnetic colloidal nanoparticles, to the molecular sensing elements bound to the surface of the resistor structure. This results in a permanent change in the GMR value of the resistor structure. The change of GMR value is proportional to the concentration of magnetic colloidal nanoparticles that interact or bind with the graphene-based nanocomposites through the bond between sensing elements and target analytes. Consequently, the concentration of target analytes binding with sensing elements can be obtained by evaluating the change of GMR value.

In another embodiment, the outer surface of said magnetic colloidal nanoparticles are modified to include molecular sensing elements bound thereto which exhibit an affinity for binding with the molecular sensing elements bound to the surface of the resistor structure, and when this binding occurs a change in the GMR value of the resistor structure occurs. When the target analytes are in a vicinity of the surface of the resister structure, the interaction with the surface occurs by the target molecules displacing the bound magnetic colloidal particles bound to the molecular sensing elements which then preferentially bind to the molecular sensing elements, resulting in the GMR value of the resistor structure returning to the same value it had before the magnetic nanoparticles were bound to the surface of the resistor surface. The degree or amount of the restoration of GMR value is depends on the amount of target analytes replacing the magnetic colloidal nanoparticles. Full restoration to the original GMR value occurs when all the magnetic colloidal nanoparticles are displaced by the target analytes.

This description is exemplary and should not be interpreted as limiting the invention or its applications. Specific parts or part numbers mentioned in the description may be substituted by functional equivalents.

Therefore what is claimed is:

1. A system for detecting one or more target analytes, comprising:
   a) a first resistor structure comprising
   a substrate,
   a graphene-based nanocomposite material located on a surface of said substrate, said graphene-based nanocomposite material exhibiting one or more magnetoresistance properties,
   a surface of said graphene-based nanocomposite material including molecular sensing elements bound thereto which exhibit an affinity for binding with said target analytes, and
   electrodes connected to said resistor structure connectable to a power source and a device for measuring a resistance across said resistor structure for sensing a giant magnetoresistance (GMR) value of said resistor structure;
   b) magnetic colloidal nanoparticles exhibiting preselected magnetic properties, an outer surface of said magnetic colloidal nanoparticles being modified to allow interaction with said surface of the resistor structure resulting in a change in the GMR value of said resistor structure;
   c) said resistor structure configured to be operably connected to,
   a magnetic field generating device configured to apply a magnetic field to said graphene-based nanocomposite wherein the field has a magnitude in a range from greater than 0 to about 5 Tesla;
   wherein a presence of target analytes in a vicinity of the surface of said resistor structure induces said interaction to occur by binding of said target analytes to said molecular sensing elements bound thereto causing a change in said GMR value of the resistor structure.

2. The system according to claim 1, wherein the magnetic colloidal nanoparticles have a diameter in a range from about 1 nm to about 1000 nm.

3. The system according to claim 1, wherein the magnetic colloidal nanoparticles are any one of Fe, Co, Ni, $Fe_xCo_y$ (x+y=100), $Fe_xNi_y$ (x+y=100), FePt, EuO, $Eu_{1-x}Gd_xSe$ ($0.02 \leq x \leq 0.8$), or $Gd_{3-x}S_4$ ($0 \leq x \leq 0.8$) based nanoparticles.

4. The system according to claim 1, wherein the magnetic colloidal nanoparticles are any one of nanoparticles containing Fe, Co, or Ni, or core-shell magnetic nanoparticles including silica coated magnetic nanoparticles, gold coated magnetic nanoparticles, or chitosan-coated magnetic nanoparticles.

5. The system according to claim 1, further comprising two or more additional resistor structures mounted on said substrate and connected in series with said first resistor structure and said power supply and said device for measuring resistance and magnetoresistance, and wherein said magnetic field generating device is configured to apply the same magnetic field to all of said resistor structures.

6. The system according to claim 1, wherein said molecular sensing elements bound to said surface of said graphene-based nanocomposite material include any one or combination of a glucose binding protein, Concanavalin A, glucose oxidase enzyme, boronic acid, antibody, DNA sequences, and amyloid-β-derived diffusible ligands (ADDLs).

7. The system according to claim 1, wherein the one or more target analytes being detected for include any one or combination of glucose, DNA, proteins, lipids, or microbes.

8. The system according to claim 1, wherein a thickness of the graphene-based nanocomposite is in a range from about 100 nm to about 5 mm.

9. The system according to claim 1, wherein the magnetic colloidal nanoparticles and graphene-based nanocomposites are selected such that the interaction between the colloidal magnetic nanoparticles and graphene-based nanocomposites changes the magnetic field in a range from about 5 Oe to about 30 KOe.

10. The system according to claim 1, wherein in use the mixture containing magnetic colloidal nanoparticles are introduced onto the surface of the resistor structure by a liquid dispenser which can be any one of a pipettor, a pump-connected microfluidic system, or a fluidic loop system.

11. The system according to claim 1, wherein in use the magnetic colloidal nanoparticles which are not bound on the surface of resistor structure after being exposed thereto are removed from the surface of the resistor structure by any one of aqueous-based washing solution, or a pumping solvent removal system, or vortex microfluidic technology.

12. The system according to claim 1, wherein during preparation of the resistor structure, a thickness of the graphene-based nanocomposite material is controlled by use of a hydraulic press, a method of physical deposition, a method of chemical coating or a method of 3-D printing.

13. The system according to claim 1, wherein the magnetic colloidal nanoparticles have a diameter in a range from about 1 nm to about 1000 nm.

14. The system according to claim 1, wherein the system is configured to be connected with a wireless system for real-time and remote detection.

15. The system according to claim 1, wherein said outer surface of said magnetic colloidal nanoparticles are modified to include molecular sensing elements bound thereto which exhibit an affinity for binding with said target analytes, and wherein when target analytes are present in a vicinity of the magnetic colloidal nanoparticles they bind to said molecular sensing elements on said magnetic colloidal nanoparticles, and when said magnetic colloidal nanoparticles with target analytes bound thereto are in a vicinity of said surface of said resister structure, the interaction with the surface is binding of the target analytes, bound to their respective magnetic colloidal nanoparticles, to said molecular sensing elements bound to said surface of said resistor structure.

16. The system according to claim 15, wherein the molecular sensing elements bound to the surface of the magnetic colloidal nanoparticles which exhibit an affinity for binding with said target analytes include functional groups selected from the group consisting of hydrogen, hydroxyl, carboxyl, amine, amide, phosphate, thiol, methyl, and polyethylene glycol (PEG) derivatives.

17. The system according to claim 1, wherein said outer surface of said magnetic colloidal nanoparticles are modified to include competing molecules bound thereto which exhibit an affinity for binding with said molecular sensing elements bound to said surface of said resistor structure, and wherein when said target analytes are in a vicinity of said surface of said resister structure, the interaction with the surface is binding of the target analytes is displacement of the bound magnetic colloidal nanoparticles and binding of said target analytes to said molecular sensing elements bound to said surface of said resistor structure.

18. The system according to claim 17, wherein said competing molecules bound to the surface of the magnetic colloidal nanoparticles which exhibit an affinity for binding with said molecular sensing elements bound to said surface of said resistor structure include functional groups selected from the group consisting of hydrogen, hydroxyl, carboxyl, amine, amide, phosphate, thiol, methyl, and polyethylene glycol (PEG) derivatives.

19. The system according to claim 1, wherein the substrate is comprised of any one of a ceramic, a polymer or a metal.

20. The system according to claim 9, wherein the ceramic comprises of any one of SiC or glass, and wherein the polymer comprises any one of polydimethylsiloxane (PDMS) or biopolymers.

21. The system according to claim 1, wherein the electrodes are comprised of metals or carbon-based materials.

22. The system according to claim 21 wherein the metals comprise any one of gold (Au), tungsten (W), platinum (Pt).

23. The system according to claim 1, wherein graphene-based nanocomposites are comprised of graphene nanosheets loaded with magnetic nanocrystals.

24. The system according to claim 23, wherein a weight ratio of said graphene to said magnetic nanocrystals is in a range from about 2:98 to about 98:2.

* * * * *